(12) United States Patent
Kao et al.

(10) Patent No.: US 9,588,427 B2
(45) Date of Patent: Mar. 7, 2017

(54) LIGHT EXPOSURE SYSTEM COMPRISING A PLURALITY OF MOVING STAGES AND LIGHT EXPOSURE PROCESS

(71) Applicant: InnoLux Corporation, Jhu-Nan, Miao-Li County (TW)

(72) Inventors: Ker-Yih Kao, Jhu-Nan (TW); Tsan-Jen Chen, Jhu-Nan (TW); Chen-Kuan Kao, Jhu-Nan (TW); Chien-Hsing Lee, Jhu-Nan (TW)

(73) Assignee: INNOLUX CORPORATION, Jhu-Nan, Miao-Li County (TW)

( * ) Notice: Subject to any disclaimer, the term of this patent is extended or adjusted under 35 U.S.C. 154(b) by 163 days.

(21) Appl. No.: 14/281,276

(22) Filed: May 19, 2014

(65) Prior Publication Data
US 2014/0368748 A1    Dec. 18, 2014

(30) Foreign Application Priority Data
Jun. 18, 2013  (TW) .............................. 102121568 A

(51) Int. Cl.
G03F 7/20 (2006.01)
(52) U.S. Cl.
CPC .................................. *G03F 7/201* (2013.01)
(58) Field of Classification Search
CPC ........... G03F 7/20; G03F 7/201; G02F 1/1303
See application file for complete search history.

(56) References Cited

U.S. PATENT DOCUMENTS

| 2008/0179565 A1* | 7/2008 | Hsieh | ...................... C07C 69/54 252/299.5 |
| 2010/0018950 A1* | 1/2010 | Aoki | ................... G03F 7/70716 216/41 |
| 2010/0255208 A1* | 10/2010 | Hara | ...................... G02F 1/1341 427/420 |

FOREIGN PATENT DOCUMENTS

| CN | 101063824 A | 10/2007 |
| TW | 546700 B | 8/2003 |
| TW | 201109802 A | 3/2011 |

* cited by examiner

*Primary Examiner* — Paul Lee
(74) *Attorney, Agent, or Firm* — Muncy, Geissler, Olds & Lowe, P.C.

(57) ABSTRACT

A light exposure system executing a light exposure process to a plurality of assembly cells, each of which includes a first substrate, a second substrate and a liquid crystal layer disposed between the first and second substrates, comprises: a transmission device; two moving stages disposed on the transmission device and carrying the assembly cells; and a light source module including at least a light emitting element, wherein the transmission device moves at least one of the moving stages carrying the assembly cell or the light source module, and the light emitting element emits the light to the assembly cell, wherein the assembly cells include a first assembly cell and a second assembly cell, the moving stages carry the first assembly cell and the second assembly cell, respectively, wherein when the light exposure process is executed to the first assembly cell, the second assembly cell receives the work of cell replacement and alignment, electrode contact and application of electric field, wherein when the light exposure process is executed to the second assembly cell, the first assembly cell receives the work of cell replacement and alignment, electrode contact and application of electric field. A light exposure process applied to the light exposure system is also disclosed.

8 Claims, 9 Drawing Sheets

LIGHT EXPOSURE SYSTEM COMPRISING A PLURALITY OF MOVING STAGES AND LIGHT EXPOSURE PROCESS

CROSS REFERENCE TO RELATED APPLICATIONS

This Non-provisional application claims priority under 35 U.S.C. §119(a) on Patent Application No(s). 102121568 filed in Taiwan, Republic of China on Jun. 18, 2013, the entire contents of which are hereby incorporated by reference.

BACKGROUND OF THE INVENTION

Field of Invention

The invention relates to a light exposure system and a light exposure process.

Related Art

With the progress of technologies, flat display devices have been widely applied to various kinds of fields. Especially, liquid crystal display (LCD) devices, having advantages such as compact structure, low power consumption, light weight and less radiation, gradually take the place of cathode ray tube (CRT) display devices and are widely applied to various electronic products, such as mobile phones, portable multimedia devices, notebooks, LCD TVs and LCD screens.

In the multi-domain vertical alignment (MVA) process for enhancing the quality of the TFT LCD, the polymer sustained alignment (PSA) technology is used to increase the production and the optical features such as aperture ratio and contrast. In the PSA technology, a photosensitive monomer is mixed during the one drop filling (ODF) process and then illuminated by the ultraviolet while an electric field is applied thereto, and therefore the photosensitive monomer within the LC molecules is photo-cured. Consequently, the photo-cured monomer will be arranged according to the pattern of a patterned transparent conductive layer of the TFT substrate, and therefore the alignment of the LC can be achieved by the photo-cured monomer.

The light exposure system used in the PSA technology takes the highest part of the cost of the light exposure equipment. However, for the current usage of the industry, a light exposure system is used for a single cell stage at a time to execute the light exposure operation (the stage is used to carry an assembly cell). Therefore, the tact time of the light exposure process is mostly squandered on the non-exposure time, such as including the panel exchange, cell alignment or the application of an electric field before the exposure. So, the light exposure system is not used effectively and adequately. Thus, if the production capacity needs to be increased, it is necessary to establish more light exposure systems and space, but this will raise the manufacturing cost and lower down the competitiveness of the product.

Therefore, it is an important subject to provide a light exposure system and a light exposure process so that the light exposure system can be used more effectively and the tact time of the light exposure process can be decreased to lower down the manufacturing cost and enhance the competitiveness of the product.

SUMMARY OF THE INVENTION

In view of the foregoing subject, an objective of the invention is to provide a light exposure system and a light exposure process so that the light exposure system can be used more effectively and the tact time of the light exposure process can be decreased to lower down the manufacturing cost and enhance the competitiveness of the product.

To achieve the above objective, a light exposure system according to the invention executes a light exposure process to an assembly cell, which includes a first substrate, a second substrate and a liquid crystal layer disposed between the first and second substrates. The light exposure system comprises a transmission device, two moving stages and a light source module. The moving stages are disposed on the transmission device and at least one of the moving stages carries the assembly cell. The light source module includes at least a light emitting element. The transmission device moves at least one of the moving stages carrying the assembly cell or the light source module and the light emitting element emits the light to the assembly cell.

To achieve the above objective, a light exposure process is also disclosed in the invention. A light exposure system is cooperated with an assembly cell, which includes a first substrate, a second substrate and a liquid crystal layer disposed between the first and second substrates. The light exposure system includes a transmission device, two moving stages disposed on the transmission device and at least one of the moving stages carrying the assembly cells, and a light source module including at least a light emitting element. The light exposure process comprises steps of: moving at least one of the moving stages carrying the assembly cell or the light source module by the transmission device; and emitting the light to the assembly cell by the light emitting element.

In one embodiment, the assembly cell further includes a photosensitive monomer, each of the first and second substrates includes a polymer thin film, and the photosensitive monomer is mixed within the liquid crystal layer or the polymer thin films.

In one embodiment, the assembly cell further includes a sealing material, the sealing material, the first substrate and the second substrate form a sealed space, and the liquid crystal layer is disposed within the sealed space.

In one embodiment, the moving stages carry a first assembly cell and a second assembly cell, respectively, the second assembly cell receives the work of cell replacement and alignment, electrode contact and application of electric field when the light exposure process is executed to the first assembly cell, and the first assembly cell receives the work of cell replacement and alignment, electrode contact and application of electric field when the light exposure process is executed to the second assembly cell.

In one embodiment, the light exposure system executes the light exposure process to the assembly cell in a stationary, scan or swing way.

As mentioned above, in the light exposure system and light exposure process according to the invention, the assembly cell is given the light exposure process, and the assembly cell includes a first substrate, a second substrate and a liquid crystal disposed between the first and second substrates. Besides, at least one of two moving stages carries the assembly cell. The transmission device can move at least one of the moving stages carrying the assembly cell or the light source module so that the light source module can emit the light to the assembly cells to complete the light exposure process. Thereby, the light exposure system is not idled for waiting for the preparatory work such as cell replacement and alignment, electrode contact or application of electric field. Therefore, the light source module of the light exposure system can be used more effectively and adequately and thus the tact time of the light exposure process can be reduced. Furthermore, the manufacturing cost is lowered down and the competitiveness of the product is enhanced.

Besides, in one embodiment of the invention, by the light exposure system and process, the problem of bright and dark bands caused by the uneven illumination provided by the light emitting elements of the light source module can be diminished.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

The light exposure system of the invention can be applied to the light exposure process of the in-plane switch (IPS) LCD apparatus, fringe field switching (FFS) LCD apparatus, vertical alignment mode (VA mode) LCD apparatus or 3D LCD apparatus. The type of the LCD apparatus is not limited in this invention.

The light exposure system 1 according to the invention can execute a light exposure process to an assembly cell. The so-called assembly cell here includes, for example, a cell including an upper substrate, a lower substrate and a liquid crystal layer, but the cell has not been scribed yet. An assembly cell can include a display panel (including an upper substrate, a lower substrate and a liquid crystal layer) or include a plurality of display panels (including a plurality of upper substrates, lower substrates and liquid crystal layers of groups, wherein an upper substrate, a lower substrate and a liquid crystal layer can constitute a display panel that has not been scribed yet). The number of the display panels included in the assembly cell is not limited here. Before illustrating the light exposure system 1, the structure of a display panel is described by referring to FIGS. 1A and 1B. To be noted, FIGS. 1A and 1B show the structure of a display panel that has been scribed but doesn't show an assembly cell (may include one ore more display panels).

Figure 1A:
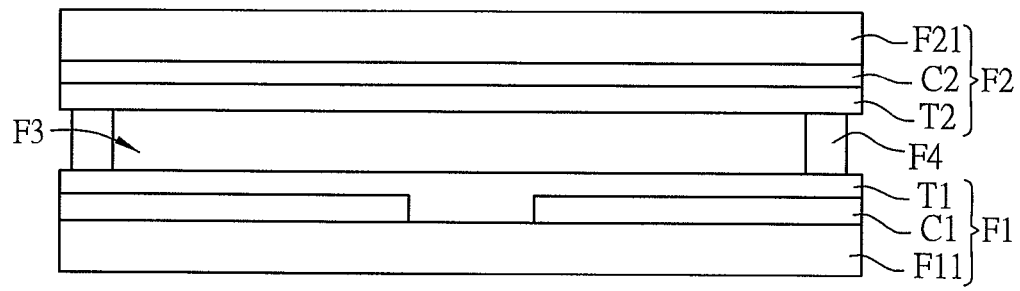
FIG. 1A is a schematic sectional diagram of a display panel.
Figure 1B:
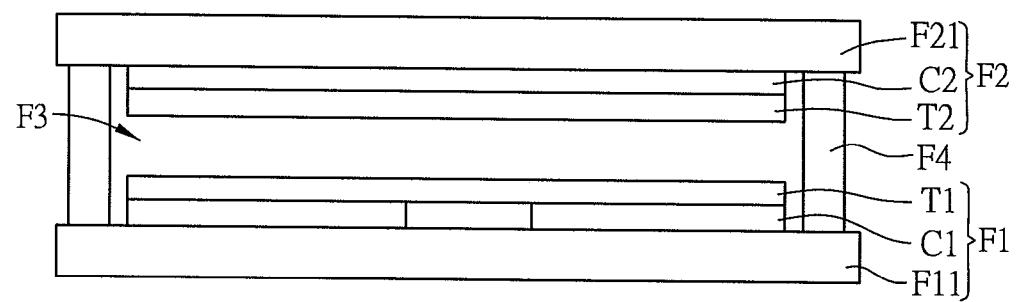
FIG. 1B is a schematic sectional diagram of another display panel.

As shown in FIG. 1A, the display panel includes a first substrate F1, a second substrate F2 and a liquid crystal (LC) layer F3 (not showing LC molecules), and the LC layer F3 is disposed between the first and second substrates F1 and F2. For example, the first substrate F1 is a thin film transistor (TFT) substrate and the second substrate F2 is a color filter (CF) substrate. However, in other embodiments, the display panel can have variations. For example, the black matrix or the color filter layer of the CF substrate can be removed to the TFT substrate, so that the first substrate F1 becomes a BOA (BM on array) substrate or a COA (color filter on array) substrate.

The first substrate F1 includes a polymer thin film T1 and a transparent substrate F11, and the second substrate F2 includes a polymer thin film T2 and a transparent substrate F21. The material of the polymer thin films T1 and T2 is, for example but not limited to, polyimide (PI). The polymer thin film T1 is disposed on the side of the transparent substrate F11 facing the second substrate F2, and the polymer thin film T2 is disposed on the side of the transparent substrate F21 facing the first substrate F1. The display panel further includes a photosensitive monomer (not shown), which can be mixed into the LC layer F3, into the polymer thin films T1 and T2, or into the LC layer F3 and the polymer thin films T1 and T2. The first substrate F1 further includes a first transparent conductive layer C1, and the second substrate F2 further includes a second transparent conductive layer C2. The material of the first or second transparent conductive layer C1 or C2 includes, for example, ITO (indium-tin oxide), IZO (indium-zinc oxide), AZO (aluminum-zinc oxide), GZO, or ZnO (zinc oxide). The first transparent conductive layer C1 is disposed between the transparent substrate F11 and the polymer thin film T1, and the second transparent conductive layer C2 is disposed between the transparent substrate F21 and the polymer thin film T2. The display panel further includes a sealing material (such as a sealant) F4, which is disposed at the edges of the first and second substrates F1 and F2. The sealing material F4, the first substrate F1 and the second substrate F2 form a sealed space, and the LC layer F3 is disposed within the sealed space.

To be noted, in this embodiment, the first transparent conductive layer C1 is a patterned transparent conductive layer and the second transparent conductive layer C2 is a non-patterned transparent conductive layer. In other embodiments, the second transparent conductive layer C2 also can be a patterned transparent conductive layer. The sealing material F4 is disposed between the polymer thin film T1, the first transparent conductive layer C1, the polymer thin film T2 and the second transparent conductive layer C2, and directly contacts the polymer thin films T1 and T2. However, in other embodiments, as shown in FIG. 1B, the polymer thin films T1 and T2 and the first and second transparent conductive layers C1 and C2 can be disposed within the sealed space formed by the sealing material F4 and the first and second substrates F1 and F2, while the sealing material F4 is disposed between the transparent substrates F11 and F21 and directly contacts the transparent substrates F11 and F21. To be noted, since the assembly cell includes at least a display panel, it can be also said that the assembly cell includes the above-mentioned components (i.e. the first substrate, second substrate, LC layer, photosensitive monomer, sealing material, etc.).

FIGS. 2A to 2E are schematic diagrams showing the operation of a light exposure system 1 according to a preferred embodiment of the invention.

Figure 2A:
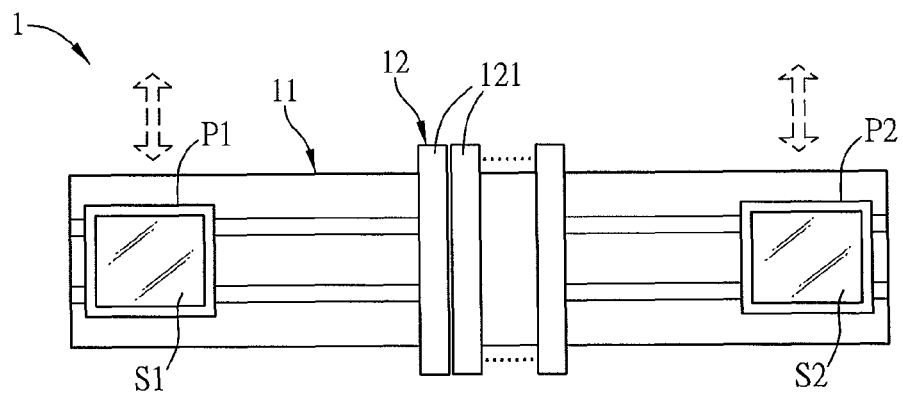
FIGS. 2A to 2E are schematic diagrams showing the operation of a light exposure system according to a preferred embodiment of the invention.

As shown in FIG. 2A, a first assembly cell S1 and a second assembly cell S2 are set to receive a light exposure process. To be noted, two or more assembly cells can be set to experience the light exposure process. Besides, an assembly cell replacing apparatus can be used to replace the assembly cell so that more assembly cells can be set to experience the light exposure process.

The light exposure system 1 includes a transmission device 11 and a light source module 12, and further includes two moving stages.

The transmission device 11 includes a linear motor, a guider, a robot arm or an air floating moving apparatus for example. Herein, the transmission device 11 is a mechanic-type moving apparatus (including a carrier, moving track, etc.). The moving stage can be a mechanic or air floating stage (moving the substrate by sending gas). Herein as shown in FIG. 2A, the moving stages P1 and P2 are mechanic moving stages for example. The first and second moving stages P1 and P2 are disposed on the transmission device 11, and can carry the first and second assembly cells S1 and S2, respectively. Besides, the transmission device 11 can move the first and second assembly cells S1 and S2 by driving the movements of the first and second moving stages P1 and P2. In this embodiment, the transmission device 11 belongs to a linear type, and can drive the first moving stage P1, the first assembly cell S1, the second moving stage P2 and the second assembly cell S2 to move linearly. The transmissions device 11 can move the first assembly cell S1 and the second assembly cell S2 individually or together.

The light source module 12 includes at least a light emitting element 121, and herein as an example, the light source module 12 includes a plurality of light emitting elements 121 (the number of which can be determined according to the requirement of the process). The light emitting element 121 can be a ultraviolet lamp and can emit the ultraviolet (UV) to the first and second assembly cells S1 and S2, so that the photosensitive monomer mixed within the LC layer F3 or the polymer thin films T1 and T2 is photo-cured.

The light exposure system 1 can further include a first assembly cell carrier and a second assembly cell carrier (not shown). The first and second assembly cell carriers can include a robot arm each for example, and can be disposed on the two sides of the transmission device 11 for holding the assembly cells to load or unload the first and second assembly cells S1 and S2, respectively. In other words, the first assembly cell carrier can perform the loading and unloading of the first assembly cell S1, and the second assembly cell carrier can perform the loading and unloading of the second assembly cell S2. The loading means an assembly cell that has not experienced the light exposure process is held by the robot arm to be put on the moving stage, and the unloading means that the assembly cell that has experienced the light exposure process is held to leave the moving stage, for example. After loading the first and second assembly cells S1 and S2, some preparatory work thereof such as cell alignment, electrode contact and application of electric filed can be performed before the light exposure. By the application of electric field, an electric field is formed between the first and second transparent conductive layers C1 and C2. Meanwhile, the photosensitive monomer is photo-cured during the light exposure process, and then the photo-cured monomer is arranged according to the pattern (i.e. slit pattern) of the first transparent conductive layer C1 of the first substrate F1. Therefore, the liquid crystal alignment can be achieved by the photo-cured monomer, and thus the optical features such as aperture ratio and contrast of the LCD apparatus can be enhanced.

Figure 2B:
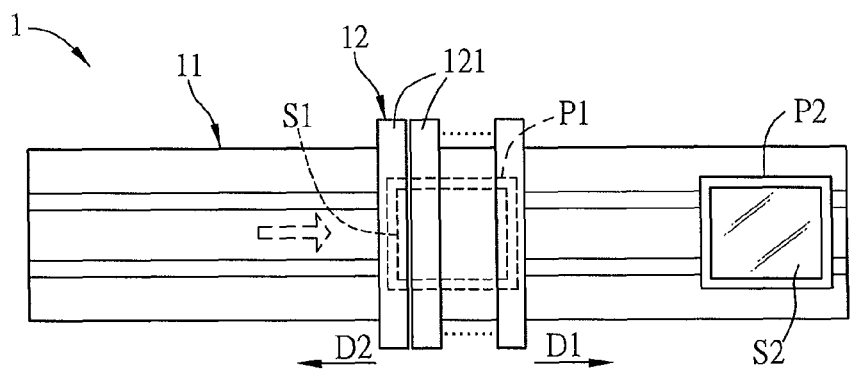
Figure 2C:
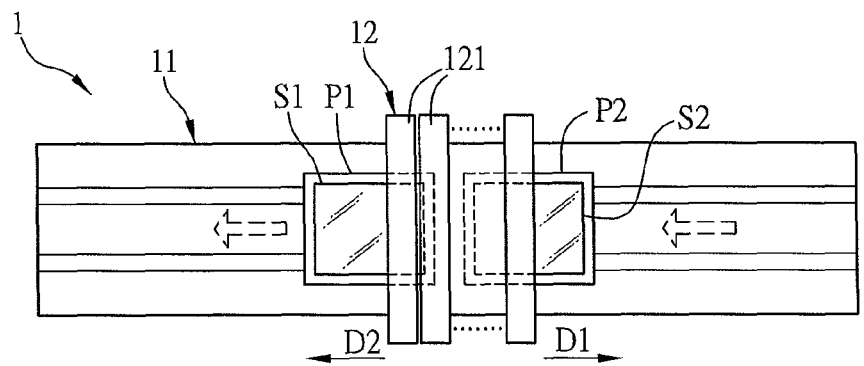
Figure 2D:
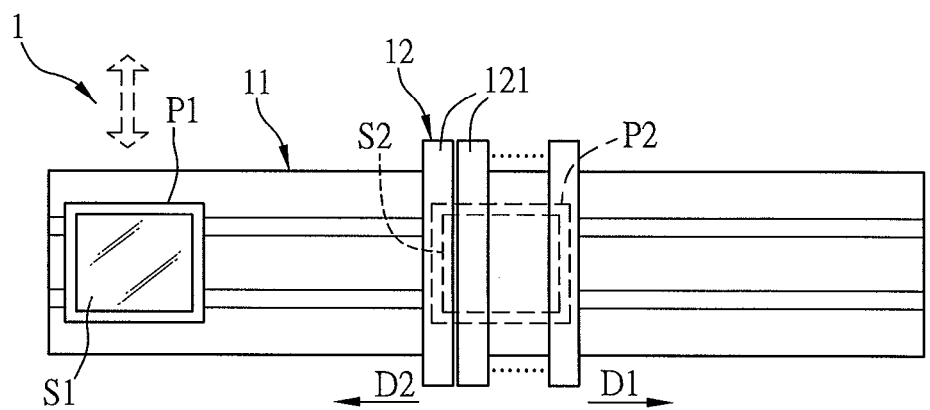
Figure 2E:
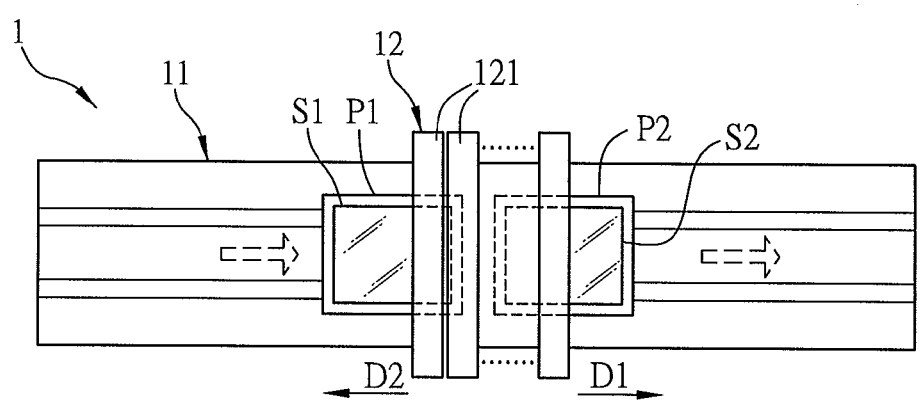
Figure 3:
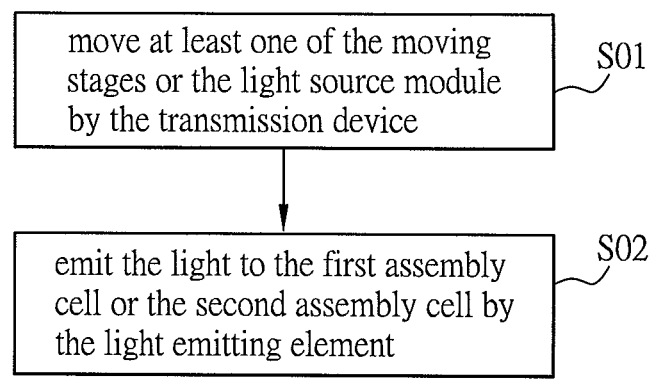
FIG. 3 is a flow chart of a light exposure process according to a preferred embodiment of the invention.

The light exposure process of the embodiment will be clearly illustrated by referring to FIGS. 2A to 2E and FIG. 3. FIG. 3 is a flow chart of a light exposure process according to a preferred embodiment of the invention.

The light exposure process includes the step S01 and S02. Before the step S01, as shown in FIG. 2A, the first assembly cell S1 is loaded by the first assembly cell carrier at one end of the transmission device 11 and located on the first moving stage P1, and the second assembly cell S2 is loaded by the second assembly cell carrier at another end of the transmission device 11 and located on the first moving stage P2. After the loading operation, some preparatory work of the first and second assembly cells S1 and S2 such as cell alignment, electrode contact and application of electric filed will be performed before the light exposure.

The step S01 is to move at least one of the moving stages or the light source module 12 by the transmission device 11. As shown in FIG. 2B, the first moving stage P1 and the first assembly cell S1 are driven along a first direction D1 by the transmission device 11 to the place under the light source module 12. In this case, just the first assembly cell S1 is moved but the second assembly cell S2 is not moved (the second assembly cell S2 may be given the preparatory work such as cell alignment, electrode contact and application of electric field).

Then, the step S02 is to emit the light to the first assembly cell S1 or the second assembly cell S2 by the light emitting element 121. Herein, when the first assembly cell S1 is moved to the place under the light source module 12, the light emitting element 121 can be switched on to emit the ultraviolet to the first assembly cell S1, and therefore the photosensitive monomer mixed within the liquid crystal layer F3 or the polymer thin films T1 and T2 can be photo-cured for achieving the LC alignment.

After completing the light exposure of the first assembly cell S1, as shown in FIG. 2C, the transmission device 11 drives the first moving stage P1, the first assembly cell S1, the second moving stage P2 and the second assembly cell S2 to move along a second direction D2, which is opposite to the first direction. For example, the first direction D1 is the rightward direction in the figure while the second direction D2 is the leftward direction in the figure, and vice versa. Then, as shown in FIG. 2D, when the second moving stage P2 and the second assembly cell S2 are driven to the place under the light source module 12 by the transmission device 11, the light emitting element 121 is switched on to emit the ultraviolet to the second assembly cell S2. When the light exposure operation is executed to the second assembly cell S2, the first assembly cell S1 can be given the work such as cell replacement and alignment, electrode contact and application of electric filed. In this embodiment, the light source module 12 is operated in a stationary way during the light exposure process, and that means the light source module 12 is stationary for the assembly cell during the light exposure process for example.

Then, as shown in FIG. 2E, the transmission device 11 drives both of the first assembly cell S1 (exactly another first assembly cell S1 that replaces the original first assembly cell and has been given the work such as alignment, electrode contact and application of electric field) and the second assembly cell S2 to move along the first direction D1. Afterward, as shown in FIG. 2B, when the first assembly cell S1 under the light source module 12 is given the light exposure, the work such as the replacement, alignment, electrode contact and application of electric field can be performed on the second assembly cell S2. Then, the operation as shown in FIG. 2C and the other figures can be executed again.

FIGS. 4A to 4E are schematic diagrams showing the operation of another light exposure system 1a according to a preferred embodiment of the invention. In this embodiment, the first and second assembly cells S1 and S2 need to receive the light exposure two times by the light source module 12 for completing the light exposure process.

At first, likewise, the first assembly cell S1 is loaded by the first assembly cell carrier at one end of the transmission device 11 and located on the first moving stage P1, and the second assembly cell S2 is loaded by the second assembly cell carrier at another end of the transmission device 11 and located on the first moving stage P2. After the loading operation, some preparatory work of the first and second assembly cells S1 and S2 such as cell alignment, electrode contact and application of electric filed will be performed before the light exposure.

Figure 4A:
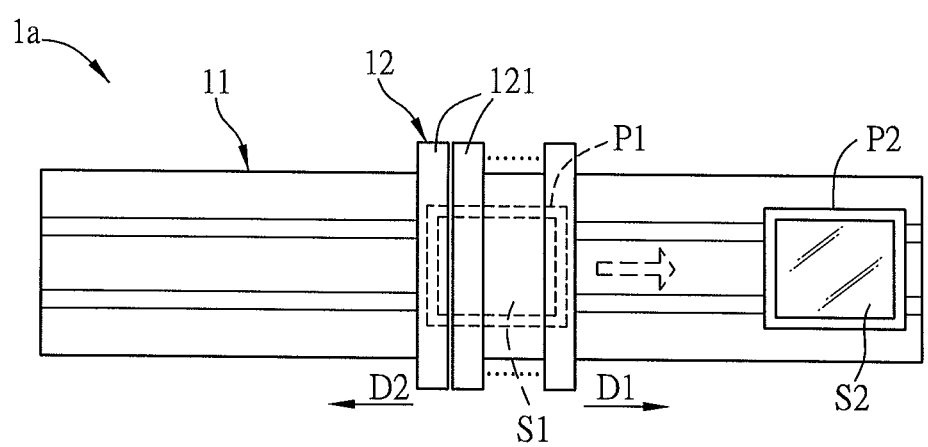
FIGS. 4A to 4E, 5A, 5B, 6A, 6B, 7A and 7B are schematic diagrams showing the variations of the operation of the light exposure system according to the embodiments of the invention.
Figure 4B:
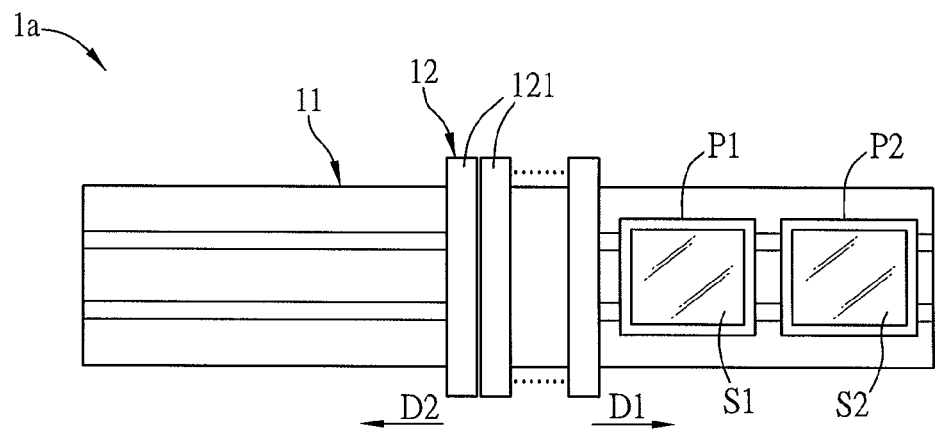

Then, as shown in FIG. 4A, the first assembly cell S1 (and the first moving stage P1) is moved along the first direction D1 by the transmission device 11 to pass through the light source module 12 so as to receive the first light exposure. In this case, just the first assembly cell S1 is moved but the second assembly cell S2 is not moved. When the first assembly cell S1 passes through the place under the light source module 12, the light source module 12 executes the light exposure to the first assembly cell S1 in a scan manner. The said scan manner means that the light emitting element 121 emits the light to the first assembly cell S1 in a dynamic exposure way for example, so that the photosensitive monomer is photo-cured and thus the LC alignment is achieved. Accordingly, as shown in FIG. 4B, the first assembly cell S1 can be moved linearly to the place near the second assembly cell S2, so that the first and second assembly cells S1 and S2 are on the same side of the transmission device 11 (the right side in FIG. 4B for example).

Figure 4C:
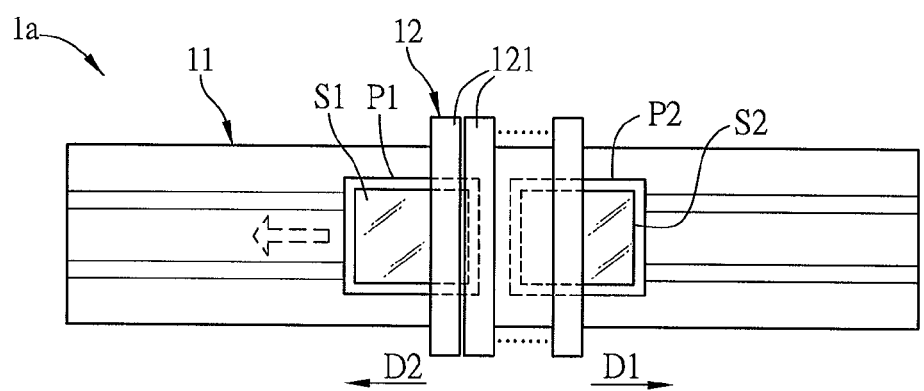
Figure 4D:
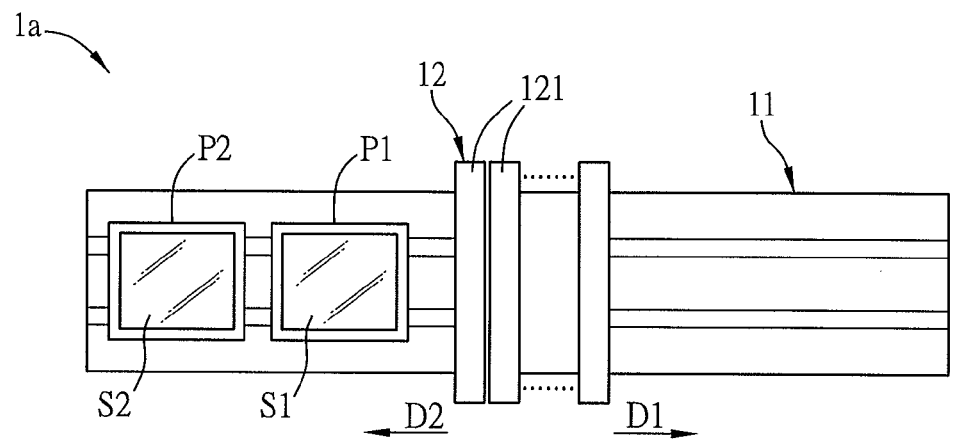

Then, as shown in FIG. 4C, the transmission device 11 moves the first and second assembly cells S1 and S2 along the second direction D2 so that the first assembly cell S1 can receive the second light exposure and the second assembly cell S2 can receive the first light exposure. In other words, when the first assembly cell S1 receives the second light exposure and the second assembly cell S2 receives the first light exposure, they are moved together along the second direction D2. As shown in FIG. 2D, the first and second assembly cells S1 and S2 are moved to the other side of the transmission device 11 (the left side in FIG. 4D for example).

Figure 4E:
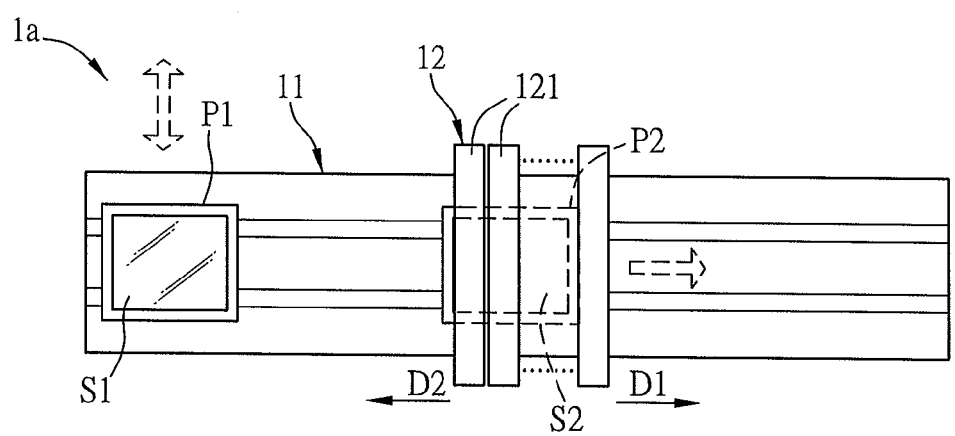

Then, as shown in FIG. 4E, the transmission device 11 moves the second assembly cell S2 (and the second moving stage P2) along the first direction D1 so that the second assembly cell S2 can be given the second light exposure. Herein, because the first assembly cell S1 has been given the light exposure two times, just the second assembly cell S2 is moved during the second light exposure of the second assembly cell S2. Meanwhile, the first assembly cell S1 can be unloaded, and another first assembly cell S1 replacing the original one can be loaded on the first moving stage P1. Besides, the new first assembly cell S1 can be given the preparatory work such as cell alignment, electrode contact and application of electric field.

When the second assembly cell S2 is given the second light exposure, the new first assembly cell S1 can be moved along the first direction D1, as shown in FIG. 4A, to receive the first light exposure because the preparatory work thereof is completed. When the first light exposure of the new first assembly cell S1 is executed, the cell replacement (including the loading and unloading), cell alignment, electrode contact and application of electric field of the second assembly cell S2 can be performed because the two-time light exposures thereof are completed.

Accordingly, in the light exposure system 1a and light exposure process of the embodiment, the moving directions of the first and second assembly cells S1 and S2 are opposite to each other when the first assembly cell S1 (along the first direction D1) is given the first light exposure and the second assembly cell S2 (along the second direction D2) is given the first light exposure. Besides, the moving directions of the first and second assembly cells S1 and S2 are also opposite to each other when the first assembly cell S1 (along the second direction D2) is given the second light exposure and the second assembly cell S2 (along the first direction D1) is given the second light exposure. In other words, the moving directions of the first and second assembly cells S1 and S2 are opposite to each other both during the first light exposures and the second light exposures.

Because the light source module 12 of the light exposure system 1a executes the dynamic exposure to the first and second assembly cells S1 and S2 in a scan way, the problem of bright and dark bands caused by the uneven illumination provided by the light emitting elements 121 of the light source module 12 can be diminished and the lamp Mura also can be diminished.

Figure 5A:
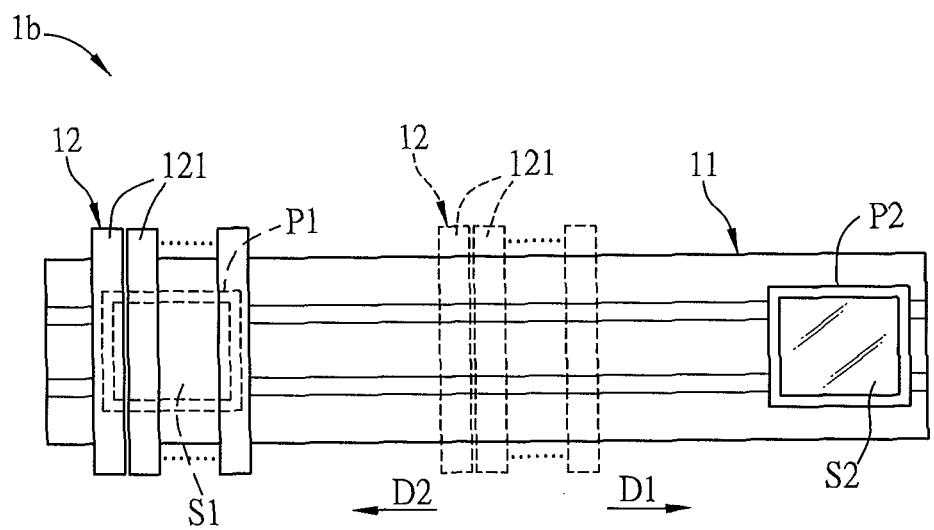
Figure 5B:
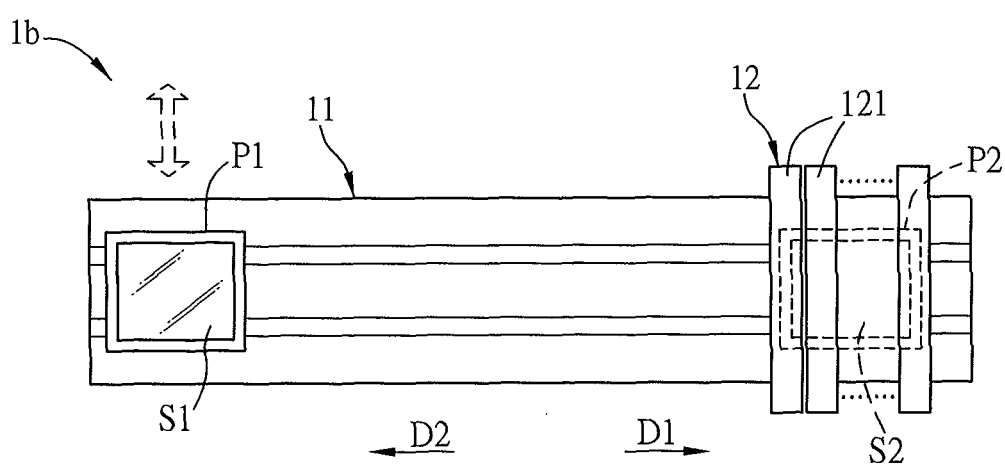

FIGS. 5A and 5B are schematic diagrams showing the operation of another light exposure system 1b according to a preferred embodiment of the invention.

At first, likewise, the first assembly cell S1 is loaded by the first assembly cell carrier at one end of the transmission device 11 and located on the first moving stage P1, and the second assembly cell S2 is loaded by the second assembly cell carrier at another end of the transmission device 11 and located on the first moving stage P2. After the loading operation, some preparatory work of the first and second assembly cells S1 and S2 such as cell alignment, electrode contact and application of electric filed will be performed before the light exposure.

Then, as shown in FIG. 5A, in this embodiment, the light source module 12 is moved along the second direction D2 by the transmission device 11 (the first and second assembly cells S1 and S2 are fixed meanwhile). Herein, the transmission device 11 also includes a moving apparatus (not shown) for moving the light source module 12 in addition to a mechanic-type moving apparatus. When the light source module 12 is moved along the second direction D2 to the place over the first assembly cell S1, the light source module 12 executes the light exposure to the first assembly cell S1 in a stationary way, and that means the light source module 12 is stationary for the assembly cell during the light exposure operation for example.

As shown in FIG. 5B, after completing the light exposure of the first assembly cell S1, the light source module 12 is moved along the first direction D1 by the transmission device 11 to the place over the second assembly cell S2 to execute the light exposure to the second assembly cell S2 in a stationary way. During the period of moving the light source module 12 to the second assembly cell S2 and the period of performing the light exposure of the second assembly cell, the work of the first assembly cell S1 such as cell replacement and alignment, electrode contact and application of electric field can be performed to set a new first assembly cell S1 with its preparatory work. Afterward, when the light exposure of the second assembly cell S2 is completed, the operation as shown in FIGS. 5A and 5B can be repeated. To be noted, when the light source module 12 is moved again to the place over the first assembly cell S1 for giving the light exposure, the work of the second assembly cell S2 such as cell replacement and alignment, electrode contact and application of electric field can be performed to set a new second assembly cell.

Figure 6A:
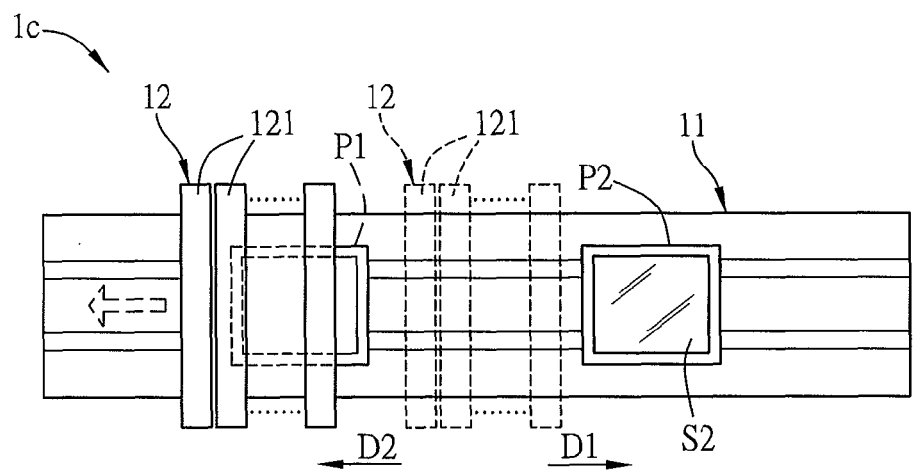
Figure 6B:
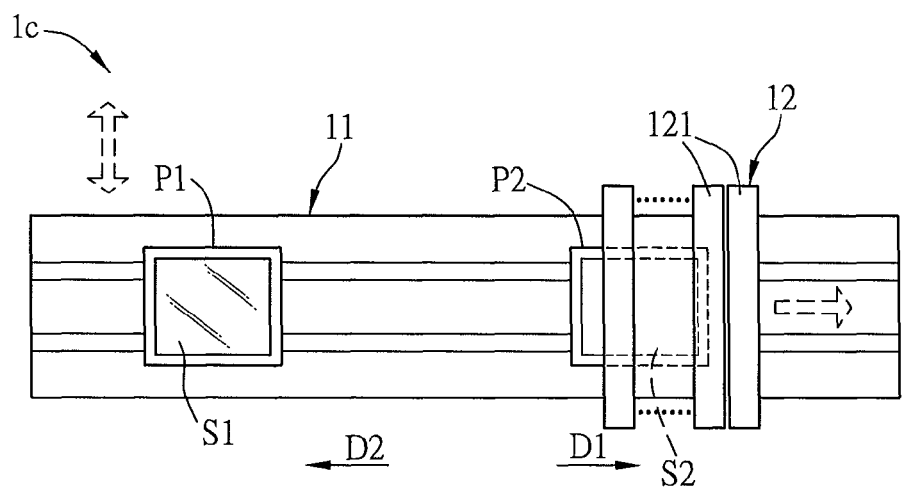

FIGS. 6A and 6B are schematic diagrams showing the operation of another light exposure system 1c according to a preferred embodiment of the invention.

At first, likewise, the first assembly cell S1 is loaded by the first assembly cell carrier at one end of the transmission device 11 and located on the first moving stage P1, and the second assembly cell S2 is loaded by the second assembly cell carrier at another end of the transmission device 11 and located on the first moving stage P2. After the loading operation, some preparatory work of the first and second assembly cells S1 and S2 such as cell alignment, electrode contact and application of electric filed will be performed before the light exposure.

Then, as shown in FIG. 6A, in this embodiment, the light source module 12 is moved along the second direction D2 by the transmission device 11. Herein, the transmission device 11 also includes a moving apparatus (not shown) for moving the light source module 12 in addition to a mechanic-type moving apparatus. When the light source module 12 is moved to pass through the place over the first assembly cell S1, the light source module 12 executes the dynamic exposure to the first assembly cell S1 in a scan way, and that means, for example, the light emitting element 121 of the light source module 12 emits the light to the first assembly cell S1 in a dynamic exposure manner while the light source module 12 passes through the first assembly cell S1.

As shown in FIG. 6B, after completing the light exposure of the first assembly cell S1, the light source module 12 is moved along the first direction D1 by the transmission device 11 to pass through the place over the second assembly cell S2 to execute the dynamic exposure to the second assembly cell S2 in a scan way. Meanwhile, the work of the first assembly cell S1 such as cell replacement and alignment, electrode contact and application of electric field can be performed to set a new first assembly cell S1 with its preparatory work. Afterward, when the light exposure of the second assembly cell S2 is completed, the operation as shown in FIGS. 6A and 6B can be repeated. To be noted, when the light source module 12 is moved again to the place over the first assembly cell S1 for giving the dynamic exposure, the work of the second assembly cell S2 such as cell replacement and alignment, electrode contact and application of electric field can be performed to set a new second assembly cell with its preparatory work. Because the light source module 12 of the light exposure system 1c executes the light exposure to the first and second assembly cells S1 and S2 in a scan way, the problem of bright and dark bands caused by the uneven illumination provided by the light emitting elements 121 of the light source module 12 can be diminished and the lamp Mura also can be diminished.

Figure 7A:
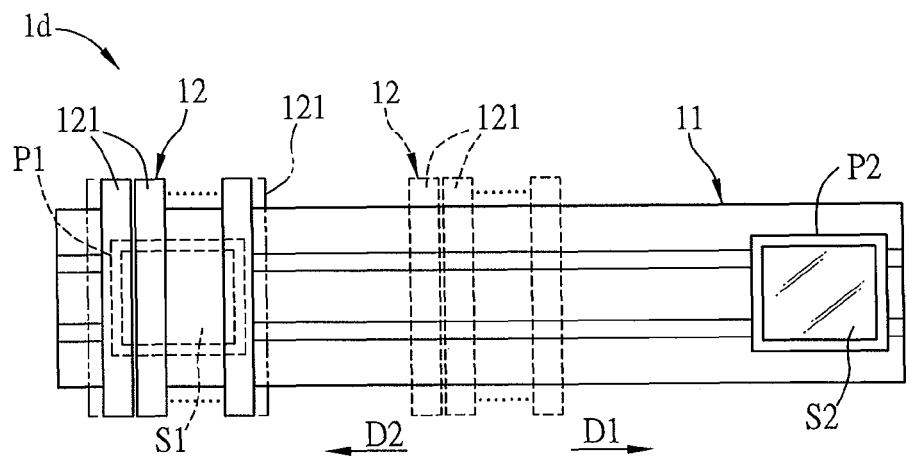
Figure 7B:
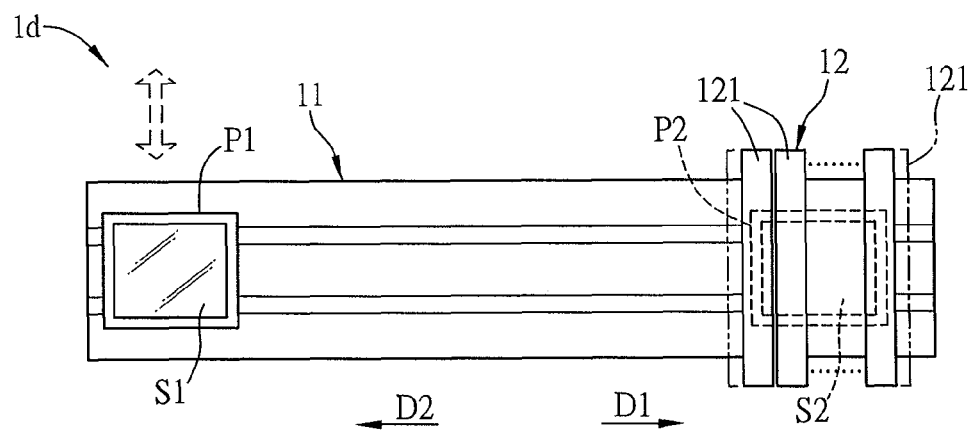

FIGS. 7A and 7B are schematic diagrams showing the operation of another light exposure system 1d according to a preferred embodiment of the invention.

At first, likewise, the first assembly cell S1 is loaded by the first assembly cell carrier at one end of the transmission device 11 and located on the first moving stage P1, and the second assembly cell S2 is loaded by the second assembly cell carrier at another end of the transmission device 11 and located on the first moving stage P2. After the loading operation, some preparatory work of the first and second assembly cells S1 and S2 such as cell alignment, electrode contact and application of electric filed will be performed before the light exposure.

Then, as shown in FIG. 7A, in this embodiment, the light source module 12 is moved along the second direction D2 by the transmission device 11. Herein, the transmission device 11 also includes a moving apparatus (not shown) for moving the light source module 12 in addition to a mechanic-type moving apparatus. When the light source module 12 is moved along the second direction D2 to the place over the first assembly cell S1, the light source module 12 executes the dynamic exposure to the first assembly cell S1 in a swing way, and that means, for example, the light source module 12 swings and emits the light to the first assembly cell S1 while moved to the place over the first assembly cell S1 so that the photosensitive monomer can be photo-cured.

As shown in FIG. 7B, after completing the light exposure of the first assembly cell S1, the light source module 12 is moved along the first direction D1 by the transmission device 11 to the place over the second assembly cell S2 to execute the dynamic exposure to the second assembly cell S2 in a swing way. Meanwhile, the work of the first assembly cell S1 such as cell replacement and alignment, electrode contact and application of electric field can be performed to set a new first assembly cell S1 with its preparatory work. Afterward, when the light exposure of the second assembly cell S2 is completed, the operation as shown in FIGS. 7A and 7B can be repeated. To be noted, when the light source module 12 is moved again to the place over the first assembly cell S1 for giving the dynamic exposure in a swing way, the work of the second assembly cell S2 such as cell replacement and alignment, electrode contact and application of electric field can be performed to set a new second assembly cell with its preparatory work. Because the light source module 12 of the light exposure system 1d executes the light exposure to the first and second assembly cells S1 and S2 in a swing way, the problem of bright and dark bands caused by the uneven illumination provided by the light emitting elements 121 of the light source module 12 can be diminished and the lamp Mura also can be diminished.

In summary, in the light exposure system and light exposure process according to the invention, the assembly cell is given the light exposure process, and the assembly cell includes a first substrate, a second substrate and a liquid crystal disposed between the first and second substrates. Besides, two moving stages are used to carry the assembly cells correspondingly. The transmission device can move at least one of the moving stages or the light source module so that the light source module can emit the light to the assembly cells to complete the light exposure process. Thereby, the light exposure system is not idled for waiting for the preparatory work such as cell replacement and alignment, electrode contact or application of electric field. Therefore, the light source module of the light exposure system can be used more effectively and adequately and thus the tact time of the light exposure process can be reduced. Furthermore, the manufacturing cost is lowered down and the competitiveness of the product is enhanced.

Besides, in one embodiment of the invention, by the light exposure system and process, the problem of bright and dark bands caused by the uneven illumination provided by the light emitting elements of the light source module can be diminished.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A light exposure system executing a light exposure process to a plurality of assembly cells, each of which includes a first substrate, a second substrate and a liquid crystal layer disposed between the first and second substrates, the light exposure system comprising:

a transmission device;

two moving stages disposed on the transmission device and carrying the assembly cells; and a light source module including at least a light emitting element, wherein the transmission device moves at least one of the moving stages carrying the assembly cell or the light source module and the light emitting element emits the light to the assembly cell, wherein the assembly cells include a first assembly cell and a second assembly cell, the moving stages carry the first assembly cell and the second assembly cell, respectively, wherein when the light exposure process is executed to the first assembly cell, the second assembly cell receives the work of cell replacement and alignment, electrode contact and application of electric field, wherein when the light exposure process is executed to the second assembly cell, the first assembly cell receives the work of cell replacement and alignment, electrode contact and application of electric field.

2. The light exposure system as recited in claim 1, wherein the assembly cell further includes a photosensitive monomer, each of the first and second substrates includes a polymer thin film, and the photosensitive monomer is mixed within the liquid crystal layer or the polymer thin films.

3. The light exposure system as recited in claim 1, wherein the assembly cell further includes a sealing material, the sealing material, the first substrate and the second substrate form a sealed space, and the liquid crystal layer is disposed within the sealed space.

4. The light exposure system as recited in claim 1, wherein the light exposure system executes the light exposure process to the assembly cell in a stationary, scan or swing way.

5. A light exposure process, wherein a light exposure system is cooperated with a plurality of assembly cells, each of which includes a first substrate, a second substrate and a liquid crystal layer disposed between the first and second substrates, the light exposure system includes a transmission device, two moving stages disposed on the transmission device and carrying the assembly cells, and a light source module including at least a light emitting element, the light exposure process comprising:

moving at least one of the moving stages carrying the assembly cell or the light source module by the transmission device; and emitting the light to the assembly cell by the light emitting element, wherein the assembly cells include a first assembly cell and a second assembly cell, the moving stages carry the first assembly cell and the second assembly cell, respectively, wherein when the light exposure process is executed to the first assembly cell, the second assembly cell receives the work of cell replacement and alignment, electrode contact and application of electric field, wherein when the light exposure process is executed to the second assembly cell, the first assembly cell receives the work of cell replacement and alignment, electrode contact and application of electric field.

6. The light exposure process as recited in claim 5, wherein the assembly cell further includes a photosensitive monomer, each of the first and second substrates includes a polymer thin film, and the photosensitive monomer is mixed within the liquid crystal layer or the polymer thin films.

7. The light exposure process as recited in claim 5, wherein the assembly cell further includes a sealing material, the sealing material, the first substrate and the second substrate form a sealed space, and the liquid crystal layer is disposed within the sealed space.

8. The light exposure process as recited in claim 5, wherein the light exposure process is executed to the assembly cell in a stationary, scan or swing way.

* * * * *